(12) United States Patent
Cho

(10) Patent No.: US 10,033,020 B2
(45) Date of Patent: Jul. 24, 2018

(54) METHOD OF MANUFACTURING ORGANIC LIGHT EMITTING DISPLAY

(71) Applicant: Samsung Display Co., Ltd., Yongin-si, Gyeonggi-do (KR)

(72) Inventor: Jae-Young Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/666,891

(22) Filed: Aug. 2, 2017

(65) Prior Publication Data

US 2017/0331077 A1   Nov. 16, 2017

Related U.S. Application Data

(62) Division of application No. 13/935,463, filed on Jul. 3, 2013, now Pat. No. 9,741,970.

(30) Foreign Application Priority Data

Feb. 18, 2013   (KR) .......................... 10-2013-0016912

(51) Int. Cl.
*H01L 51/56* (2006.01)
*H01L 27/32* (2006.01)
*H01L 51/00* (2006.01)

(52) U.S. Cl.
CPC .......... *H01L 51/56* (2013.01); *H01L 27/3211* (2013.01); *H01L 51/0013* (2013.01)

(58) Field of Classification Search
CPC ... H01L 27/3211; H01L 51/0013; H01L 51/56
See application file for complete search history.

(56) References Cited

U.S. PATENT DOCUMENTS

| | | | |
|---|---|---|---|
| 9,048,456 B2 | 6/2015 | Chang et al. | |
| 2005/0012451 A1 | 1/2005 | Yuki et al. | |
| 2007/0046185 A1 | 3/2007 | Kim | |
| 2008/0108157 A1 | 5/2008 | Matsuda et al. | |
| 2009/0220705 A1 | 9/2009 | Mizuno et al. | |
| 2010/0048084 A1 | 2/2010 | Pyo et al. | |
| 2013/0001531 A1* | 1/2013 | Park | H01L 27/3211 257/40 |

FOREIGN PATENT DOCUMENTS

| | | |
|---|---|---|
| KR | 10-2007-0024286 A | 3/2007 |
| KR | 10-2008-0012146 A | 2/2008 |
| KR | 10-2010-0022714 A | 3/2010 |
| KR | 10-2012-0015675 A | 2/2012 |
| KR | 10-2013-0007308 | 1/2013 |

* cited by examiner

*Primary Examiner* — Bilkis Jahan
*Assistant Examiner* — Victor Barzykin
(74) *Attorney, Agent, or Firm* — Lewis Roca Rothgerber Christie LLP

(57) ABSTRACT

A method of manufacturing an organic light emitting display includes forming a first light-emitting layer on a substrate, forming a first portion of a second light-emitting layer on the first light-emitting layer, forming a third light-emitting layer on the first light-emitting layer, and forming a second portion of the second light-emitting layer on the first portion of the second light-emitting layer.

8 Claims, 6 Drawing Sheets

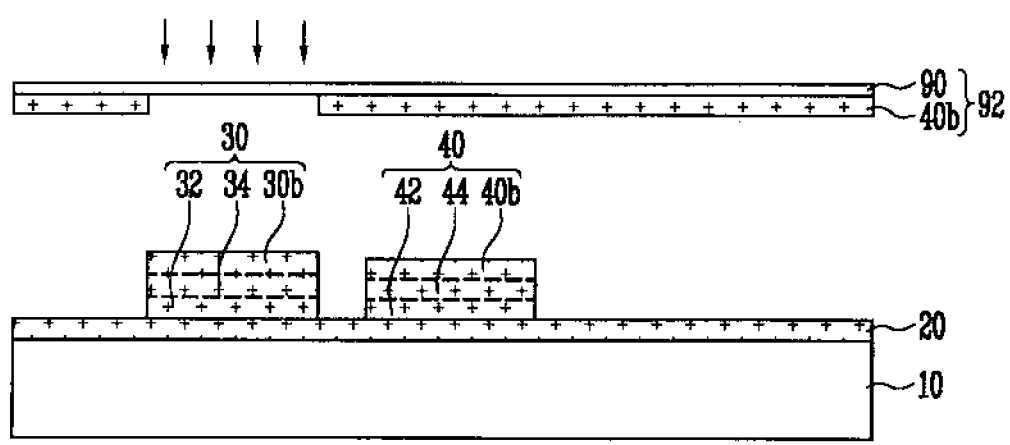

METHOD OF MANUFACTURING ORGANIC LIGHT EMITTING DISPLAY

CROSS-REFERENCE TO RELATED APPLICATION

This application is a divisional of U.S. patent application Ser. No. 13/935,463, filed Jul. 3, 2013, which claims priority to and the benefit of Korean Patent Application No. 10-2013-0016912, filed on Feb. 18, 2013, the entire contents of both of which are incorporated herein by reference.

BACKGROUND

1. Field

Embodiments of the present invention relate to a method of manufacturing an organic light emitting display.

2. Description of the Related Art

An organic light emitting diode (OLED) emits light due to a difference in energy that occurs when holes injected through an anode electrode and electrons injected through a cathode electrode are re-combined with each other in a light-emitting layer. The emitted light may have different wavelengths, for example, red, green, and blue wavelengths, according to the properties of the light-emitting layer. The wavelength of the emitted light may be determined by a material (an organic matter including a host material and a dopant material) of the light-emitting layer.

The light-emitting layer may be formed by evaporating or depositing the material, or by performing transcription (e.g., the act of transcribing) using a donor film.

When the light-emitting layer is transcribed using the donor film, the light-emitting layer may be defectively transcribed depending on a degree of flatness of a surface of a substrate (e.g., a surface of a substrate that is not perfectly flat), or may be defectively transcribed due to an energy of a surface of the donor film, or may be transcribed to an undesired region.

SUMMARY

Accordingly, embodiments of the present invention provide a method of manufacturing an organic light emitting display capable of reducing or preventing a defect of a light-emitting layer.

Embodiments of the present invention also provide a method of manufacturing an organic light emitting display in which a light-emitting layer may be well transcribed to a desired region.

To achieve the foregoing and/or other aspects of embodiments of the present invention, according to an embodiment of the present invention, there is provided a method of manufacturing an organic light emitting display, the method including forming a first light-emitting layer on a substrate, forming a first portion of a second light-emitting layer on the first light-emitting layer, forming a third light-emitting layer on the first light-emitting layer, and forming a second portion of the second light-emitting layer on the first portion of the second light-emitting layer.

The first light-emitting layer may be formed in a first sub-pixel region, a second sub-pixel region, and a third sub-pixel region.

The second light-emitting layer may be formed in the first sub-pixel region, and the third light-emitting layer may be formed in the second sub-pixel region.

The second light-emitting layer may be thicker than the third light-emitting layer.

The first light-emitting layer may be a blue light-emitting layer, the second light-emitting layer may be a red light-emitting layer, and the third light-emitting layer may be a green light-emitting layer.

The first portion of the second light-emitting layer may include an intermediate layer and an auxiliary layer, and the second portion of the second light-emitting layer may include an organic layer.

Forming the first portion of the second light-emitting layer may include placing a donor film, which includes the auxiliary layer and the intermediate layer laminated on a base member, close to the first light-emitting layer, and irradiating the donor film to transcribe the auxiliary layer and the intermediate layer to the first light-emitting layer.

Forming the second portion of the second light-emitting layer may include placing a donor film, which includes the organic layer on a base member, close to the first portion of the second light-emitting layer, and irradiating the donor film to transcribe the organic light-emitting layer to the auxiliary layer.

The third light-emitting layer may include an intermediate layer, an auxiliary layer, and an organic layer.

Forming the third light-emitting layer may include placing a donor film, which includes the organic layer, the auxiliary layer, and the intermediate layer laminated on a base member, close to the first light-emitting layer, and irradiating the donor film to transcribe the organic layer, the auxiliary layer, and the intermediate layer to the first light-emitting layer.

According to another embodiment of the present invention, there is provided a method of manufacturing an organic light emitting display, the method including forming a first light-emitting layer on a substrate, forming a first portion of a second light-emitting layer on the first light-emitting layer, forming a first portion of a third light-emitting layer on the first light-emitting layer, forming a second portion of the second light-emitting layer on the first portion of the second light-emitting layer, and forming a second portion of the third light-emitting layer on the first portion of the third light-emitting layer.

The first light-emitting layer may be formed in a first sub-pixel region, a second sub-pixel region, and a third sub-pixel.

The second light-emitting layer may be formed in the first sub-pixel region, and the third light-emitting layer may be formed in the second sub-pixel region.

The first light-emitting layer may be a blue light-emitting layer, the second light-emitting layer may be a red light-emitting layer, and the third light-emitting layer may be a green light-emitting layer.

The first portion of the second light-emitting layer may include an intermediate layer and an auxiliary layer, and the second portion of the second light-emitting layer may include an organic layer.

Forming the first portion of the second light-emitting layer may include placing a donor film, which includes the auxiliary layer and the intermediate layer laminated on a base member, close to the first light-emitting layer, and irradiating the donor film to transcribe the auxiliary layer and the intermediate layer to the first light-emitting layer.

Forming the second portion of the second light-emitting layer may include placing a donor film, which includes the organic layer on a base member, close to the first portion of the second light-emitting layer, and irradiating the donor film to transcribe the organic light-emitting layer to the auxiliary layer.

The first portion of the third light-emitting layer may include an intermediate layer and an auxiliary layer, and the second portion of the third light-emitting layer may include an organic layer.

Forming the first portion of the third light-emitting layer may include placing a donor film, which includes the auxiliary layer and the intermediate layer laminated on a base member, close to the first light-emitting layer, and irradiating the donor film to transcribe the auxiliary layer and the intermediate layer to the first light-emitting layer.

Forming the second portion of the third light-emitting layer may include placing a donor film, which includes the organic layer on a base member, close to the first portion of the third light-emitting layer, and irradiating the donor film to transcribe the organic layer to the auxiliary layer.

According to still another embodiment, there is provided a method of manufacturing an organic light emitting display, the method including forming a first light-emitting layer in a first sub-pixel region, a second sub-pixel region, and a third sub-pixel region of a substrate, forming a first portion of a second light-emitting layer and a first portion of a third light-emitting layer respectively on the first light-emitting layer at the first sub-pixel region and on the first light-emitting layer at the second sub-pixel region, forming a second portion of the second light-emitting layer on the first portion of second light-emitting layer, and forming a second portion of the third light-emitting layer on the first portion of the third light-emitting layer.

The second light-emitting layer may be thicker than the third light-emitting layer.

The first light-emitting layer may be a blue light-emitting layer, the second light-emitting layer may be a red light-emitting layer, and the third light-emitting layer may be a green light-emitting layer.

Each of the first portion of the second light-emitting layer and the first portion of the third light-emitting layer may include an intermediate layer and a first auxiliary layer.

Forming the first portion of the second light-emitting layer and the first portion of the third light-emitting layer may include placing a donor film, which includes the first auxiliary layer and the intermediate layer laminated on a base member, close to the first light-emitting layer, and irradiating the donor film to transcribe the first auxiliary layer and the intermediate layer to the first light-emitting layer at the first sub-pixel region and the first light-emitting layer at the second sub-pixel region.

Forming the second portion of the second light-emitting layer may include placing a donor film, which includes an organic layer and a second auxiliary layer on a base member, close to the first portion of the second light-emitting layer, and irradiating the donor film to transcribe the organic layer and the second auxiliary layer to the first auxiliary layer at the first sub-pixel region.

The second portion of the third light-emitting layer may include an organic layer.

Forming the second portion of the third light-emitting layer may include placing a donor film, which includes an organic layer on a base member, close to the first portion of the third light-emitting layer, and irradiating the donor film to transcribe the organic layer to a first auxiliary layer at the second sub-pixel region.

According to embodiments of the present invention, when no less than two light-emitting layers that emit different light components are sequentially formed on the substrate, one light-emitting layer is formed at least twice. Since the previously formed light-emitting layer of the partial thickness functions as the spacer, when the other light-emitting layer is formed, the light-emitting layer does not smear, or is not defectively formed, and may be correctly formed in a desired region.

BRIEF DESCRIPTION OF THE DRAWINGS

The accompanying drawings, together with the specification, illustrate exemplary embodiments of the present invention, and, together with the description, serve to explain aspects of embodiments of the present invention, wherein:

FIGS. 4A to 4D are sectional views illustrating a method of manufacturing an organic light emitting display according to still another embodiment of the present invention.

DETAILED DESCRIPTION

Figure 1:
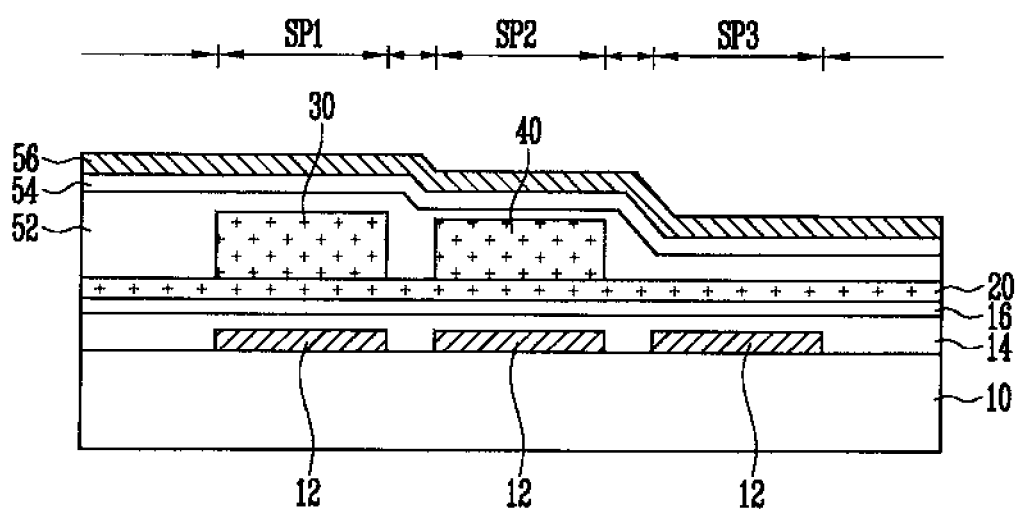
FIG. 1 is a sectional view illustrating an organic light emitting display according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature, and not restrictive. In addition, when an element is referred to as being "on" another element, it can be directly on the other element, or can be indirectly on the other element with one or more intervening elements interposed therebetween. Also, when an element is referred to as being "connected to" another element, it can be directly connected to the other element, or it can be indirectly connected to the other element with one or more intervening elements interposed therebetween. Hereinafter, like reference numerals refer to like elements.

Hereinafter, embodiments of the present invention will be described more fully with reference to the accompanying drawings, in which exemplary embodiments of the invention are shown. The described embodiments may, however, be embodied in many different forms, and should not be construed as being limited to the embodiments set forth herein; rather these embodiments are provided so that this disclosure will be thorough and complete, and will fully convey the concept of embodiments of the present invention to those skilled in the art.

FIG. 1 is a sectional view illustrating an organic light emitting display according to an embodiment of the present invention. An organic light emitting display according to the present embodiment includes a substrate including a display region, in which an image is displayed, and a non-display region around the display region, a plurality of pixels formed in the display region of the substrate, and an encapsulation unit for sealing the plurality of pixels.

Each of the plurality of pixels includes a plurality of sub-pixels, for example, a red sub-pixel, a green sub-pixel, a blue sub-pixel, and a white sub-pixel. Each of the sub-pixels may be formed of an organic light emitting diode (OLED), which includes an anode electrode, a cathode electrode, and a light-emitting layer located between the anode electrode and the cathode electrode. A hole injecting layer and a hole transport layer may be interposed between the anode electrode and the light-emitting layer. An electron transport layer and an electron injecting layer may be interposed between the light-emitting layer and the cathode electrode.

FIG. 1 illustrates a part of a display region in which an image is displayed. Regions respectively corresponding to ones of a plurality of sub-pixels that form a pixel, for example, a first sub-pixel region SP1, a second sub-pixel region SP2, and a third sub-pixel SP3 region, are illustrated.

Referring to FIG. 1, a first electrode 12 is formed in each of the first sub-pixel region SP1, the second sub-pixel region SP2, and the third sub-pixel region SP3 of a substrate 10. Further, a hole injecting layer 14 and a hole transport layer 16 are formed on the substrate 10 and the first electrode 12. The hole injecting layer 14 or the hole transport layer 16 may be omitted, or may be formed of a plurality of layers.

A first light-emitting layer 20 is formed on the hole transport layer 16. In FIG. 1, the first light-emitting layer 20 is commonly formed in the first sub-pixel region SP1, the second sub-pixel region SP2, and the third sub-pixel region SP3. However, in other embodiments of the present invention, the first light-emitting layer 20 may be selectively formed only in a single region.

A second light-emitting layer 30 is formed on the first light-emitting layer 20 in/at the first sub-pixel region SP1, and a third light-emitting layer 40 is formed on the first light-emitting layer 20 in/at the second sub-pixel region SP2.

An electron transport layer 52 and an electron injecting layer 54 are formed on the first light-emitting layer 20, the second light-emitting layer 30, and the third light-emitting layer 40. A second electrode 56 is formed on the electron injecting layer 54.

In other embodiments of the present invention, the electron transport layer 52 or the electron injecting layer 54 may be omitted, or may be formed of a plurality of layers.

The above-described organic light emitting display may be manufactured as described below.

The organic light emitting display according to the present embodiment of the present invention may be manufactured by methods disclosed in Korean Patent Publications Nos. 10-2013-0007307 and 10-2013-0007308 (both published on Jan. 18, 2013) invented by the applicant/inventor of the present invention. However, the embodiments of the present invention are not limited to the above disclosed methods, and well-known various embodiments may be applied.

Figure 2A:
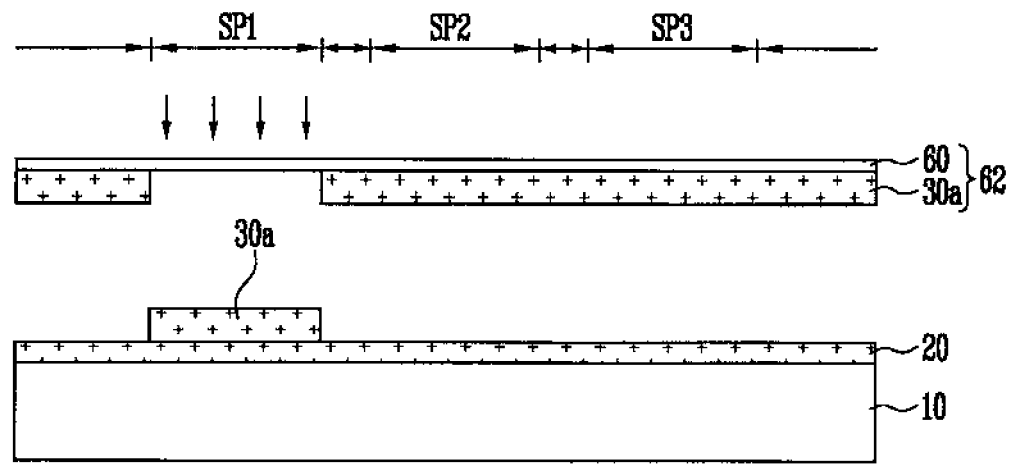
FIGS. 2A to 2C are sectional views illustrating a method of manufacturing an organic light emitting display according to an embodiment of the present invention.
Figure 2B:
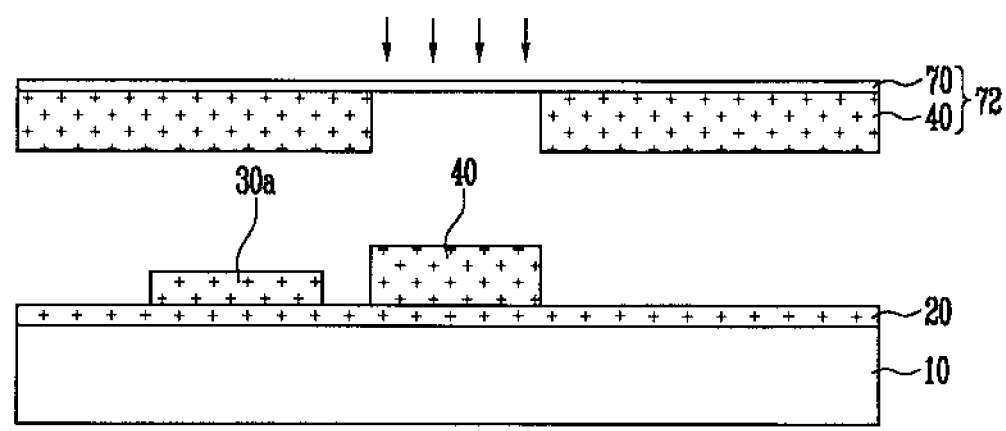
Figure 2C:
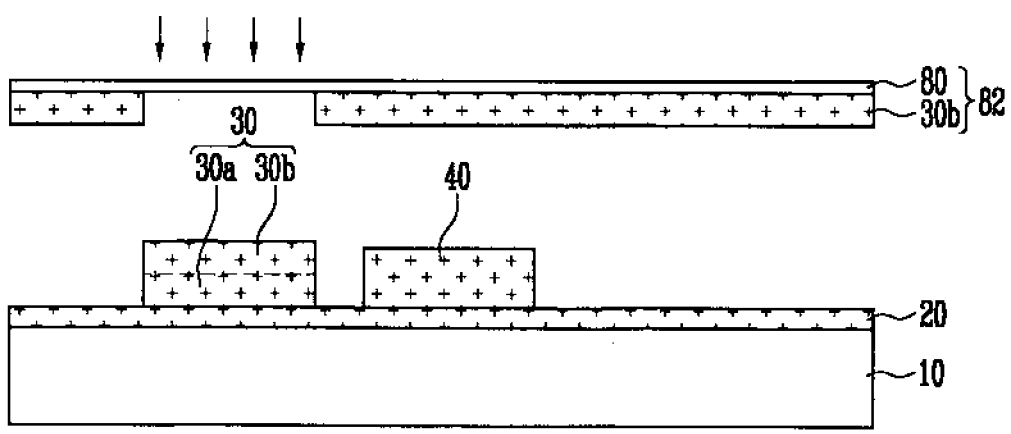

FIGS. 2A to 2C are sectional views illustrating a method of manufacturing an organic light emitting display according to an embodiment of the present invention.

Referring to FIG. 1, the first electrode 12, which is formed as an anode electrode, is formed in each of the first sub-pixel region SP1, the second sub-pixel region SP2, and the third sub-pixel region SP3 of the substrate 10, and the hole injecting layer 14 and the hole transport layer 16 are formed on the substrate 10 and the first electrode 12.

In the present embodiment, which is described hereinafter, manufacturing processes will be omitted, and processes of forming the first light-emitting layer 20, the second light-emitting layer 30, and the third light-emitting layer 40 on the substrate 10 will be mainly described.

Referring to FIG. 2A, the first light-emitting layer 20 is formed in the first sub-pixel region SP1, the second sub-pixel region SP2, and the third sub-pixel region SP3 of the substrate 10, and a second light-emitting layer 30a of a partial thickness (e.g., a first portion 30a of the second light-emitting layer 30) is formed on the first light-emitting layer 20 in the first sub-pixel region SP1. The partial thickness may correspond to 30% to 70% of an entire thickness of the second light-emitting layer 30.

For example, when a donor film 62 (in which the second light-emitting layer 30a of the partial thickness is formed on a base member 60) is kept close to the first light-emitting layer 20, and when light, heat, or laser is irradiated to the donor film 62 at the first sub-pixel region SP1, the second light-emitting layer 30a of the partial thickness may be transcribed to the first light-emitting layer 20 at the first sub-pixel region SP1.

Referring to FIG. 2B, the third light-emitting layer 40 is formed on the first light-emitting layer 20 at the second sub-pixel region SP2.

For example, when a donor film 72 (in which the third light-emitting layer 40 is formed on a base member 70) is place/kept close to the first light-emitting layer 20, and when laser is irradiated to the donor film 72 corresponding to the second sub-pixel region SP2, the third light-emitting layer 40 may be transcribed to the first light-emitting layer 20 in the second sub-pixel region SP2.

Referring to FIG. 2C, a second light-emitting layer 30b of a remaining thickness (e.g., a second portion 30b of the second light-emitting layer 30) is formed on the first portion 30a the second light-emitting layer 30.

For example, when a donor film 82 (in which the second portion 30b of the second light-emitting layer 30, also referred to as the second light-emitting layer 30b of additional/remaining thickness, is formed on a base member 80) is placed and kept close to the second light-emitting layer 30a of the partial thickness on the first light-emitting layer 20, and when laser is irradiated to the donor film 82 corresponding to the first sub-pixel region SP1, the second light-emitting layer 30b of the remaining thickness may be transcribed on the second light-emitting layer 30a of the partial thickness.

In the above embodiment, the second light-emitting layer 30 is formed twice (e.g., is formed in two stages, or by two processes). However, in other embodiments of the present invention, the third light-emitting layer 40 may be formed twice, and the second light-emitting layer 30 may be formed by a single process.

In other embodiments, when the second light-emitting layer 30 of the entire thickness (e.g., the entire second light-emitting layer 30) is instead formed by a single process, although laser is irradiated only to the donor film 62 corresponding to the first sub-pixel region SP1, the second sub-pixel region SP2 or the third sub-pixel region SP3 adjacent to the first sub-pixel region SP1 may be smeared with a portion of the second light-emitting layer 30.

When a surface of the substrate 10 is not flat, or when energy of a surface of the donor film 62 is high, the second light-emitting layer 30 may be transcribed to the second sub-pixel region SP2 or to the third sub-pixel region SP3 around the first sub-pixel region SP1. When the second light-emitting layer 30 is transcribed to the second sub-pixel region SP2 or the third sub-pixel region SP3, because the first light-emitting layer 20 and the second light-emitting layer 30 overlap in the second and third sub-pixel regions SP2 and SP3, a defect such as a surface spot is caused. Furthermore, a defect caused by the firstly transcribed second light-emitting layer 30 may be larger than (e.g., has a greater deleterious effect than) a defect caused by the secondly transcribed third light-emitting layer 40.

In the present embodiment of the present invention, to reduce or prevent the above-described defect, the firstly transcribed second light-emitting layer 30 is formed at least twice (e.g., is formed by at least two separate processes). Since the previously formed second light-emitting layer 30a of the partial thickness functions as a spacer, the third light-emitting layer 40 may be correctly formed in the second sub-pixel region SP2. That is, because the third light-emitting layer 40 previously contacts the second light-emitting layer 30a having a relatively large step difference to be transcribed to the second sub-pixel region SP2, the third light-emitting layer 40 may be correctly transcribed without smearing to the second sub-pixel region SP2.

Figure 3A:
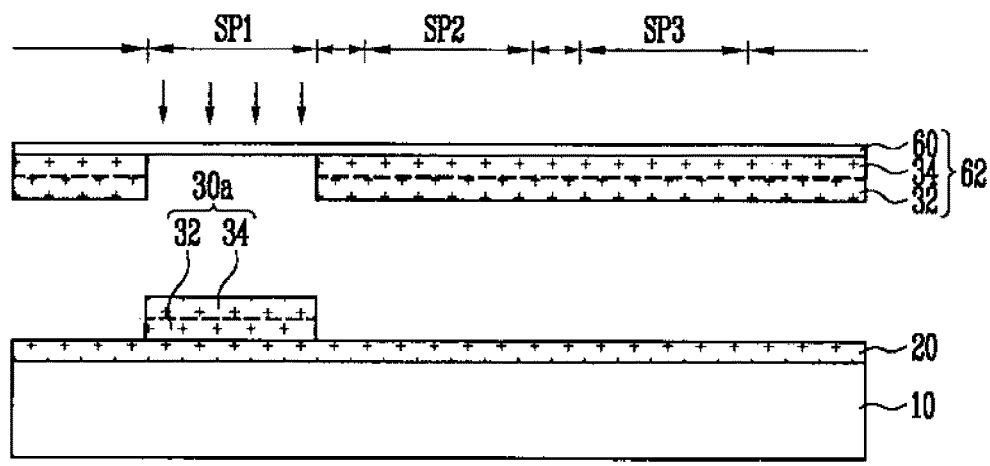
FIGS. 3A to 3C are sectional views illustrating a method of manufacturing an organic light emitting display according to another embodiment of the present invention.
Figure 3B:
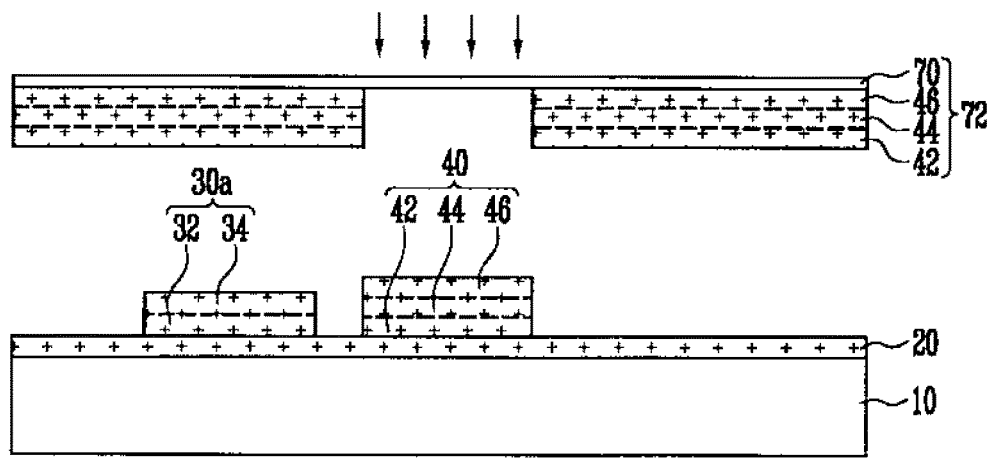
Figure 3C:
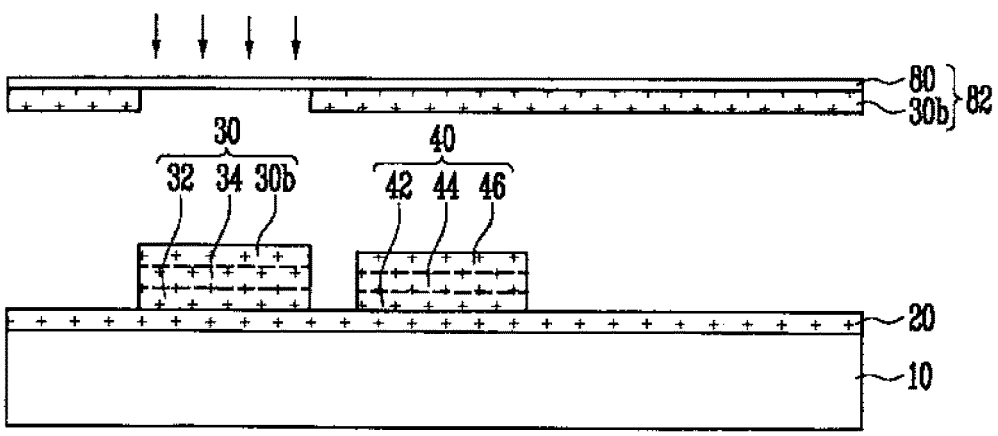

FIGS. 3A to 3C are sectional views illustrating a method of manufacturing an organic light emitting display according to another embodiment of the present invention.

In the embodiment of FIGS. 2A to 2C, the first, second, and third light-emitting layers 20, 30, and 40 are formed of materials that may emit visible rays of light of specific colors. In the present embodiment, each of the second and third light-emitting layers 30 and 40 includes an intermediate layer, an auxiliary layer, and an organic layer. The intermediate layers are formed to improve a transport efficiency of holes. The auxiliary layers are formed to control optical thicknesses (resonance distances) of the light-emitting layers so that a micro-cavity effect may be realized. The organic layers are formed of materials that may emit visible rays of light of specific colors.

Referring to FIG. 3A, the first light-emitting layer 20 is formed in the first sub-pixel region SP1, the second sub-pixel region SP2, and the third sub-pixel region SP3 of the substrate, and the second light-emitting layer 30a of the partial thickness (e.g., a first portion 30a of the second light-emitting layer 30) is formed on the first light-emitting layer 20 in the first sub-pixel region SP1. The second light-emitting layer 30a of the partial thickness may include an intermediate layer 32 and an auxiliary layer 34.

For example, when the donor film 62 (in which the auxiliary layer 34 and the intermediate layer 32 are laminated on the base member 60) is kept close to the first light-emitting layer 20, and when a laser is irradiated to the donor film 62 corresponding to the first sub-pixel region SP1, the auxiliary layer 34 and the intermediate layer 32 may be transcribed to the first light-emitting layer 20 at the first sub-pixel region SP1.

Referring to FIG. 3B, the third light-emitting layer 40 is formed on the first light-emitting layer 20 at the second sub-pixel region SP2. The third light-emitting layer 40 may include an intermediate layer 42, an auxiliary layer 44, and an organic layer 46.

For example, when the donor film 72 (in which the organic layer 46, the auxiliary layer 44, and the intermediate layer 42 are laminated on the base member 70) is kept close to the second light-emitting layer 30a on the first light-emitting layer 20, and when a laser is irradiated to the donor film 72 corresponding to the second sub-pixel region SP2, the organic layer 46, the auxiliary layer 44, and the intermediate layer 42 may be transcribed to the first light-emitting layer 20 at the second sub-pixel region SP2.

Referring to FIG. 3C, the second light-emitting layer 30b of additional/remaining thickness (e.g., a second/remaining portion 30b of the second light-emitting layer 30) is formed on the second light-emitting layer 30a of the partial thickness. The second light-emitting layer 30b of the remaining thickness may include an organic layer.

For example, when the donor film 82 (in which the organic layer 30b is formed on the base member 80) is kept close to the second light-emitting layer 30a on the first light-emitting layer 20, and when laser is irradiated to the donor film 82 corresponding to the first sub-pixel region SP1, the organic layer 30b may be transcribed to the auxiliary layer 34.

In the above embodiment, the firstly transcribed second light-emitting layer 30 is formed at least twice (e.g., is formed using at least two processes) so that the second light-emitting layer 30a of the partial thickness includes additional functional layers, for example, the intermediate layer 32 and the auxiliary layer 34, while the second light-emitting layer 30b of the remaining thickness includes the organic layer.

Since the previously formed second light-emitting layer 30a of the partial thickness functions as a spacer, the third light-emitting layer 40 may be correctly formed only in a desired region, for example, the second sub-pixel region SP2.

In the above embodiment, the second light-emitting layer 30 is formed twice/is formed in two stages. However, in other embodiments of the present invention, the third light-emitting layer 40 may be formed twice, and the second light-emitting layer 30 may be formed by one process.

FIGS. 4A to 4D are sectional views illustrating a method of manufacturing an organic light emitting display according to still another embodiment of the present invention.

In the embodiments described above, only one of the second light-emitting layer 30 or the third light-emitting layer 40 is formed by two processes. However, in the present embodiment, the second light-emitting layer 30 and the third light-emitting layer 40 are both formed by two processes. Each of the second and third light-emitting layers 30 and 40 includes an intermediate layer, an auxiliary layer, and an organic layer.

The intermediate layers (e.g., 32 and 42) are formed to improve transport efficiency of holes. The auxiliary layers (e.g., 34 and 44) are formed to control optical thicknesses (resonance distances) of the light-emitting layers so that micro-cavity effect may be realized. The organic layers are formed of materials that may emit visible rays of specific colors.

Figure 4A:
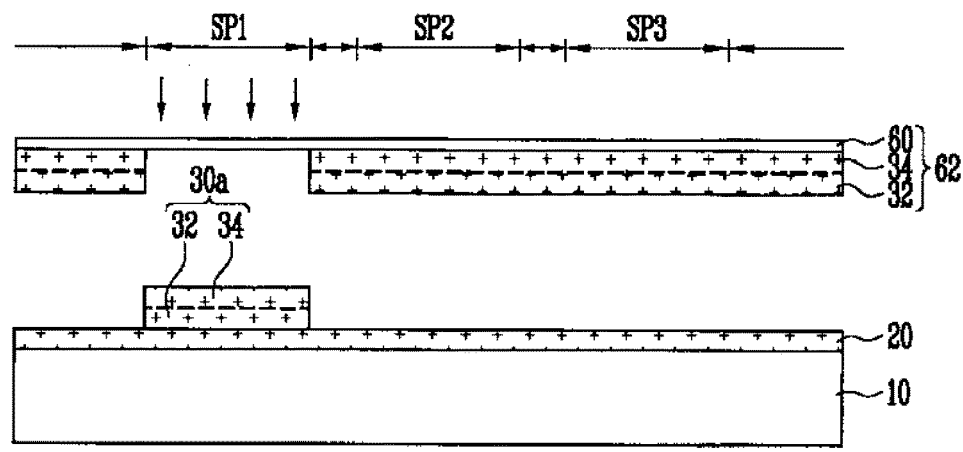

Referring to FIG. 4A, the first light-emitting layer 20 is formed in the first sub-pixel region SP1, the second sub-pixel region SP2, and the third sub-pixel region SP3 of the substrate and the second light-emitting layer 30a of the partial thickness is formed on the first light-emitting layer 20 of the first sub-pixel region SP1. The second light-emitting layer 30a of the partial thickness may include the intermediate layer 32 and the auxiliary layer 34.

For example, when the donor film 62 (in which the auxiliary layer 34 and the intermediate layer 32 are laminated on the base member 60) is kept close to the first light-emitting layer 20, and when laser is irradiated to the donor film 62 corresponding to the first sub-pixel region SP1, the auxiliary layer 34 and the intermediate layer 32 may be transcribed to the first light-emitting layer 20 of the first sub-pixel region SP1.

Figure 4B:
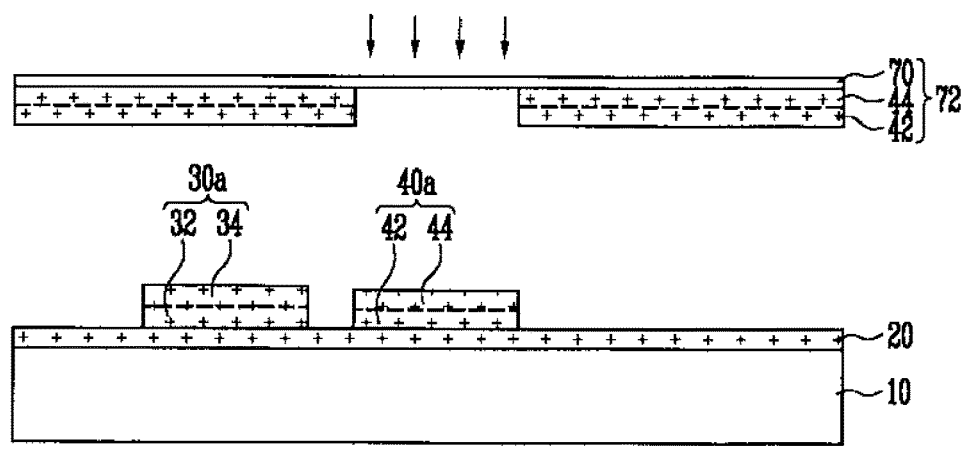

Referring to FIG. 4B, a third light-emitting layer 40a of a partial thickness (e.g., a first portion 40a of the third light-emitting layer 40) is formed on the first light-emitting layer 20 at the second sub-pixel region SP2. The third light-emitting layer 40a of the partial thickness may include the intermediate layer 42, the auxiliary layer 44, and the organic layer 46.

For example, when the donor film 72 (in which the auxiliary layer 44 and the intermediate layer 42 are laminated on the base member 70) is kept close to the first light-emitting layer 20, and when laser is irradiated to the donor film 72 corresponding to the second sub-pixel region SP2, the auxiliary layer 44 and the intermediate layer 42 may be transcribed to the first light-emitting layer 20 of the second sub-pixel region SP2.

Figure 4C:
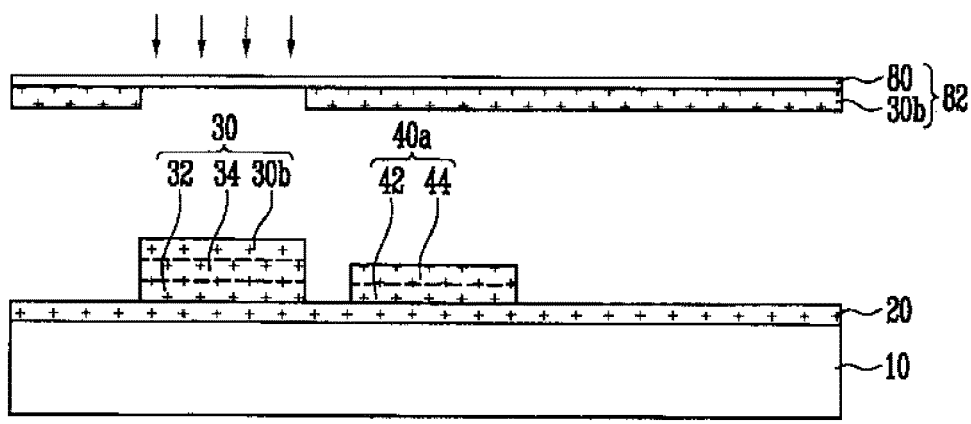

Referring to FIG. 4C, the second light-emitting layer 30b of the remaining thickness is formed on the second light-emitting layer 30a in the first sub-pixel region SP1. The second light-emitting layer 30b of the remaining thickness may include the organic layer.

For example, when the donor film 82 (in which the organic layer 30b is formed on the base member 80) is kept close to the second light-emitting layer 30a on the first light-emitting layer 20, and when laser is irradiated to the donor film 82 corresponding to the first sub-pixel region SP1, the organic layer 30b may be transcribed to the auxiliary layer 34.

Referring to FIG. 4D, a third light-emitting layer 40b of an additional/remaining thickness (e.g., a second portion 40b of the third light-emitting layer 40) is formed on the third light-emitting layer 40a of the second sub-pixel region SP2. The third light-emitting layer 40b of the remaining thickness may include the organic layer.

For example, when a donor film 92 (in which the organic layer 40b is formed on a base member 90) is kept close to the third light-emitting layer 40a on the first light-emitting layer 20, and when a laser is irradiated to the donor film 92 corresponding to the second sub-pixel region SP2, the organic layer 40b may be transcribed to the auxiliary layer 44.

In the above embodiment, the firstly transcribed second light-emitting layer 30 and the secondly transcribed third light-emitting layer 40 are formed using two different processes (e.g., are each formed using two processes, or using four processes in total).

Because the previously formed second light-emitting layer 30a of the partial thickness and the third light-emitting layer 40a of the partial thickness function as spacers, the second light-emitting layer 30 and the third light-emitting layer 40 may be correctly formed in a desired region.

Figure 5A:
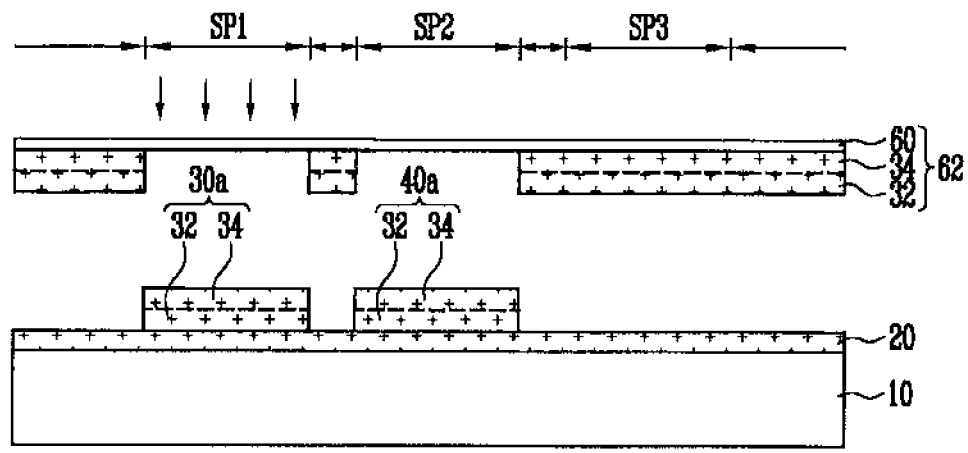
FIGS. 5A to 5C are sectional views illustrating a method of manufacturing an organic light emitting display according to still another embodiment of the present invention.
Figure 5B:
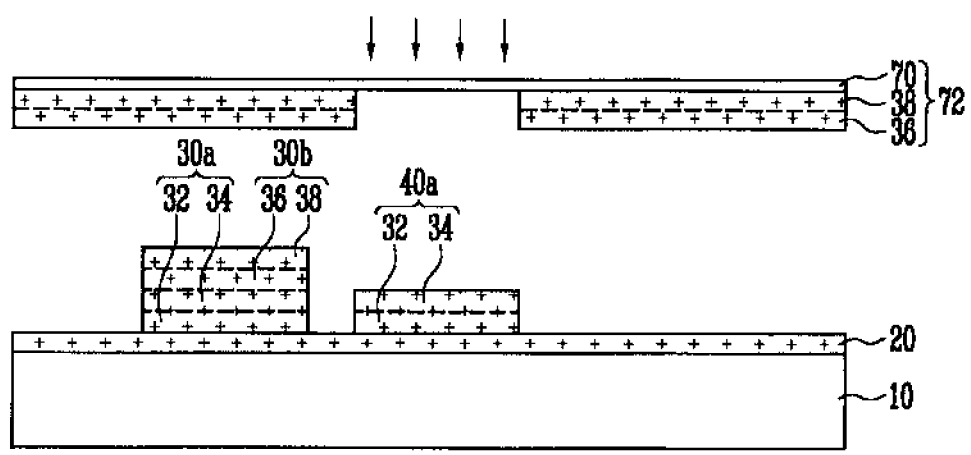
Figure 5C:
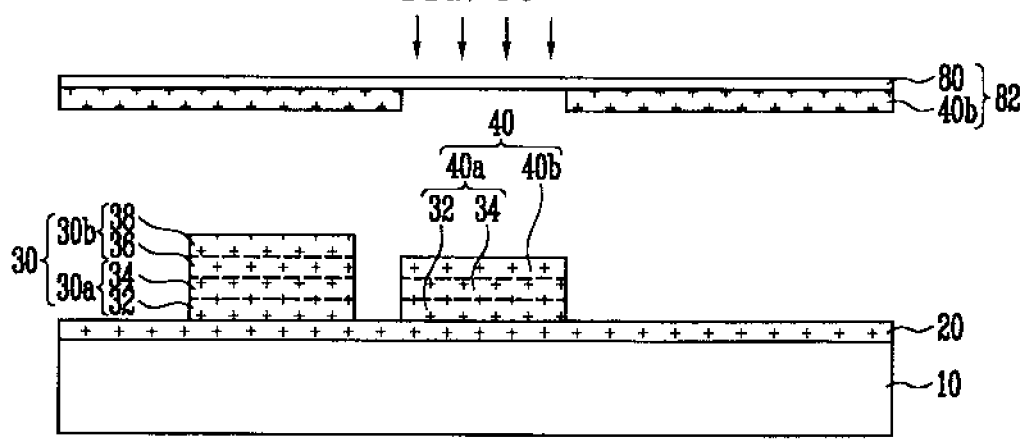

FIGS. 5A to 5C are sectional views illustrating a method of manufacturing an organic light emitting display according to still another embodiment of the present invention.

In the present embodiment, like in the embodiment of FIGS. 4A to 4D, the second light-emitting layer 30 and the third light-emitting layer 40 are formed by two separate processes. Further, the second light-emitting layer 30a of the partial thickness and the third light-emitting layer 40a of the partial thickness are formed during the same process. The present embodiment may be effectively applied when the second light-emitting layer 30 and the third light-emitting layer 40 include the same material.

Referring to FIG. 5A, the first light-emitting layer 20 is formed in the first sub-pixel region SP1, the second sub-pixel region SP2, and the third sub-pixel region SP3 of the substrate 10, and the second light-emitting layer 30a of the partial thickness and the third light-emitting layer 40a of the partial thickness are respectively formed on the first light-emitting layer 20 at the first sub-pixel region SP1 and at the second sub-pixel region SP2. Each of the second light-emitting layer 30a of the partial thickness and the third light-emitting layer 40a of the partial thickness may include the intermediate layer 32 and a first auxiliary layer 34. That is, the intermediate layer 32 and the first auxiliary layer 34 may be commonly formed in the first sub-pixel region SP1 and the second sub-pixel region SP2, and may be formed of the same material.

For example, when the donor film 62 (in which the first auxiliary layer 34 and the intermediate layer 32 are laminated on the base member 60) is kept close to the first light-emitting layer 20, and when laser is irradiated to the donor film 62 corresponding to the first sub-pixel region SP1 and the second sub-pixel region SP2, the first auxiliary layer 34 and the intermediate layer 32 may be transcribed to the first light-emitting layer 20 at the first sub-pixel region SP1 and at the second sub-pixel region SP2.

Referring to FIG. 5B, the second light-emitting layer 30b of the remaining thickness is formed on the second light-emitting layer 30a at the first sub-pixel region SP1. The second light-emitting layer 30b of the remaining thickness of the present embodiment may include a second auxiliary layer 36 and an organic layer 38.

For example, when the donor film 72 (in which the organic layer 38 and the second auxiliary layer 36 are formed on the base member 70) is kept close to the second light-emitting layer 30a on the first light-emitting layer 20, when and laser is irradiated to the donor film 72 corresponding to the first sub-pixel region SP1, the organic layer 38 and the second auxiliary layer 36 may be transcribed to the first auxiliary layer 34 of the first sub-pixel region SP1.

Referring to FIG. 5C, the third light-emitting layer 40b of the remaining thickness is formed on the third light-emitting layer 40a of the second sub-pixel region SP2. The third light-emitting layer 40b of the remaining thickness of the present embodiment may include the organic layer.

For example, when the donor film 82 in which the organic layer 40b is formed on the base member 80 is kept close to the third light-emitting layer 40a on the first light-emitting layer 20, and when laser is irradiated to the donor film 82 corresponding to the second sub-pixel region SP2, the organic layer 40b may be transcribed to the first auxiliary layer 34 at the second sub-pixel region SP2.

In the above embodiments, one of the light-emitting layers formed in two processes may be a relatively, or comparatively, thick light-emitting layer. For example, the second light-emitting layer 30 is thicker than the third light-emitting layer 40.

In the above embodiments, the first light-emitting layer 20 may be a blue light-emitting layer, the second light-emitting layer 30 may be a red light-emitting layer, and the third light-emitting layer 40 may be a green light-emitting layer. Alternatively, the first light-emitting layer 20 may be a blue light-emitting layer, the second light-emitting layer 30 may be a green light-emitting layer, and the third light-emitting layer 40 may be a red light-emitting layer.

Although not described in the above embodiments, referring to FIG. 1, the electron transport layer 52 and the electron injecting layer 54 are formed on the first light-emitting layer 20, the second light-emitting layer 30, and the third light-emitting layer 40, and the second electrode 56 as the cathode electrode is formed on the electron injecting layer 54.

While embodiments of the present invention have been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an organic light emitting display, the method comprising:
    forming a first light-emitting layer on a substrate including a first sub-pixel region, a second sub-pixel region, and a third sub-pixel region;
    forming a first portion of a second light-emitting layer on the first light-emitting layer in the first sub-pixel region;
    forming a first portion of a third light-emitting layer on the first light-emitting layer in the second sub-pixel region after the forming of the first portion of the second light-emitting layer;
    forming a second portion of the second light-emitting layer on the first portion of the second light-emitting layer in the first sub-pixel region after the forming of the first portion of the third light-emitting layer; and
    forming a second portion of the third light-emitting layer on the first portion of the third light-emitting layer in the second sub-pixel region after the forming of the second portion of the second light-emitting layer.

2. The method as claimed in claim 1, wherein the first light-emitting layer is a blue light-emitting layer,
    wherein the second light-emitting layer is a red light-emitting layer, and
    wherein the third light-emitting layer is a green light-emitting layer.

3. The method as claimed in claim 1,
    wherein the first portion of the second light-emitting layer comprises an intermediate layer and an auxiliary layer, and
    wherein the second portion of the second light-emitting layer comprises an organic layer.

4. The method as claimed in claim 3, wherein forming the first portion of the second light-emitting layer comprises:
    placing a donor film, which comprises the auxiliary layer and the intermediate layer laminated on a base member, close to the first light-emitting layer; and
    irradiating the donor film to transcribe the auxiliary layer and the intermediate layer to the first light-emitting layer.

5. The method as claimed in claim 3, wherein forming the second portion of the second light-emitting layer comprises:
    placing a donor film, which comprises the organic layer on a base member, close to the first portion of the second light-emitting layer; and
    irradiating the donor film to transcribe the organic light emitting layer to the auxiliary layer.

6. The method as claimed in claim 1, wherein the first portion of the third light-emitting layer comprises an intermediate layer and an auxiliary layer, and
    wherein the second portion of the third light-emitting layer comprises an organic layer.

7. The method as claimed in claim 6, wherein forming the first portion of the third light-emitting layer comprises:
    placing a donor film, which comprises the auxiliary layer and the intermediate layer laminated on a base member, close to the first light-emitting layer; and
    irradiating the donor film to transcribe the auxiliary layer and the intermediate layer to the first light-emitting layer.

8. The method as claimed in claim 6, wherein forming the second portion of the third light-emitting layer comprises:
    placing a donor film, which comprises the organic layer on a base member, close to the first portion of the third light-emitting layer; and
    irradiating the donor film to transcribe the organic layer to the auxiliary layer.

* * * * *